(12) United States Patent
Taniguchi et al.

(10) Patent No.: US 7,888,765 B2
(45) Date of Patent: Feb. 15, 2011

(54) OPTICAL SEMICONDUCTOR DEVICE

(75) Inventors: Masaki Taniguchi, Hyogo (JP);
Hisatada Yasukawa, Kyoto (JP);
Takaki Iwai, Osaka (JP)

(73) Assignee: Panasonic Corporation, Osaka (JP)

( * ) Notice: Subject to any disclaimer, the term of this patent is extended or adjusted under 35 U.S.C. 154(b) by 168 days.

(21) Appl. No.: 12/173,429

(22) Filed: Jul. 15, 2008

(65) Prior Publication Data
US 2009/0032896 A1    Feb. 5, 2009

(30) Foreign Application Priority Data
Jul. 30, 2007    (JP) .............................. 2007-197810

(51) Int. Cl.
*H01L 31/102*    (2006.01)
(52) U.S. Cl. ............... 257/464; 257/186; 257/E31.057; 257/E31.069
(58) Field of Classification Search ................. 257/186, 257/E31.069, 462, 464
See application file for complete search history.

(56) References Cited

U.S. PATENT DOCUMENTS

| | | | | |
|---|---|---|---|---|
| 4,157,269 A | * | 6/1979 | Ning et al. .................. | 438/359 |
| 4,633,287 A | * | 12/1986 | Yamazaki ...................... | 257/9 |
| 4,644,149 A | * | 2/1987 | Tsunekawa et al. ...... | 250/214 A |
| 4,686,554 A | * | 8/1987 | Ohmi et al. .................. | 257/443 |
| 5,596,186 A | | 1/1997 | Kobayashi | |
| 5,965,875 A | | 10/1999 | Merrill | |
| 2003/0080280 A1 | | 5/2003 | Takimoto et al. | |
| 2005/0001231 A1 | | 1/2005 | Hayashida et al. | |
| 2005/0212045 A1 | | 9/2005 | Tamai | |
| 2008/0277749 A1 | * | 11/2008 | Enichlmair et al. ......... | 257/432 |

FOREIGN PATENT DOCUMENTS

| | | |
|---|---|---|
| JP | 05-235394 | 9/1993 |
| JP | 09-186355 | 7/1997 |

* cited by examiner

*Primary Examiner*—Wael M Fahmy
*Assistant Examiner*—John C Ingham
(74) *Attorney, Agent, or Firm*—McDermott Will & Emery LLP

(57) ABSTRACT

An optical semiconductor device includes a phototransistor for receiving incident light. The phototransistor includes a collector layer of a first conductivity type formed on a semiconductor substrate, a base layer of a second conductivity type formed on the collector layer, and an emitter layer of a first conductivity type formed on the base layer. A thickness of the emitter layer is equal to or less than an absorption length of the incident light in the semiconductor substrate.

6 Claims, 9 Drawing Sheets

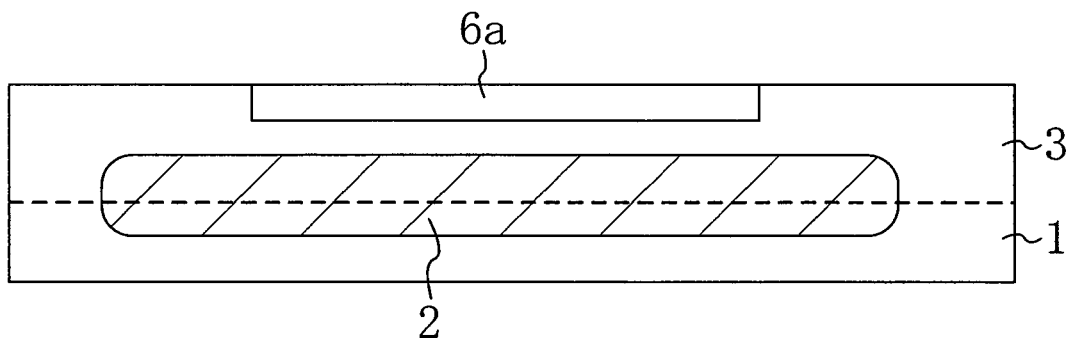
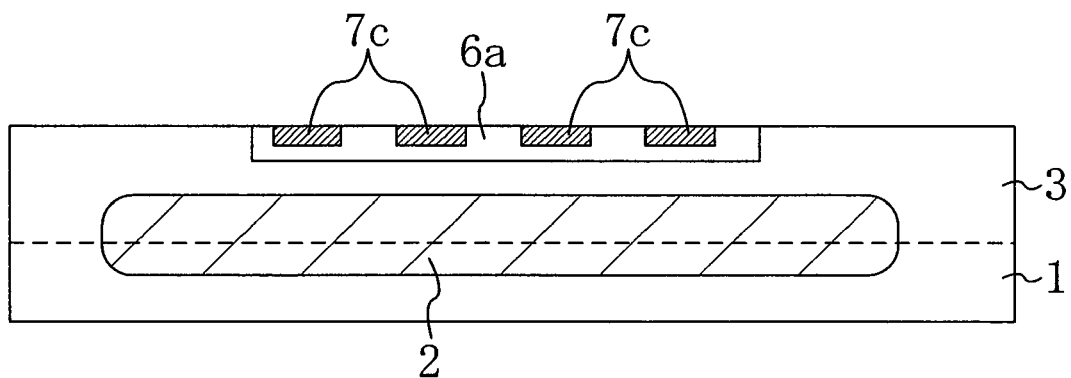
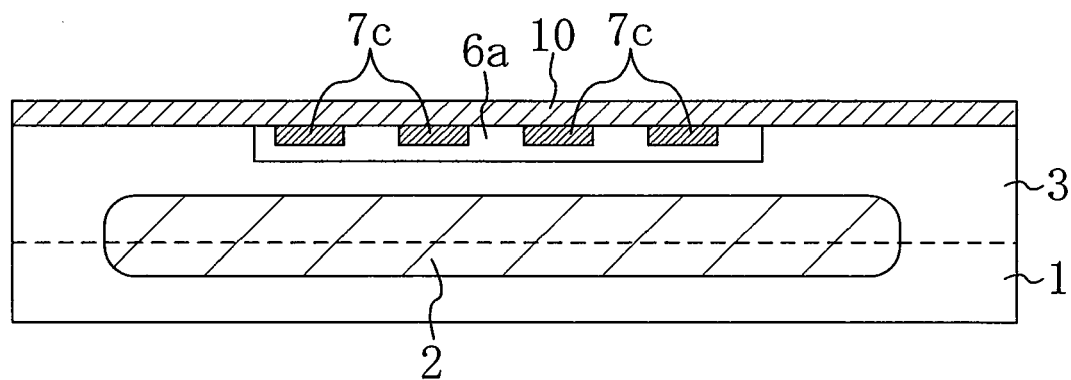

OPTICAL SEMICONDUCTOR DEVICE

CROSS REFERENCE TO RELATED APPLICATION

This application claims priority under 35 U.S.C. §119 on Patent Application No. 2007-197810 filed in Japan on Jul. 30, 2007, the entire contents of which are hereby incorporated by reference.

BACKGROUND OF THE INVENTION

1. Field of the Invention

The invention relates to an optical semiconductor device having a phototransistor.

2. Related Art

An example of optical semiconductor devices is an OEIC (Optical Electronic Integrated Circuit) device in which a light-receiving element (such as a photodiode) for converting an optical signal to an electric signal, and an active element (such as a transistor element) and a passive element (such as a resistor element and a capacitor element) which form a peripheral circuit are formed on a common substrate. Such an OEIC has been used as various kinds of optical sensor devices, optical pickup devices for optical discs, and the like as a function to convert an optical signal to an electric signal.

Higher light-receiving sensitivity and operation speed have been demanded for OEICs that are used as an optical pickup device. In addition to optical pickup devices for CDs (Compact Discs) using infrared light and for DVDs (Digital Versatile Discs) using red light, optical pickup devices for BDs (Blu-ray Discs) using blue light have come into use recently. Therefore, there are currently three types of optical pickup devices altogether. With improvement in operation speed and multilayer recording of BDs, a higher operation speed and lower noise have been demanded for the OEICs.

Regarding OEICs for BDs, the demand for noise characteristics (S/N (signal-to-noise) ratio) is strict due to the low reflectance of blue light from optical discs. The noise characteristics can be improved by either increasing S (signal) or reducing N (noise). S can be increased by improving light-receiving sensitivity of a light-receiving element. In OEICs using a Si (silicon) photodiode, however, light-receiving sensitivity to blue light has almost reached the theoretical limit. Therefore, an APD (Avalanche Photo-Diode) or phototransistor having an amplifying function in the light-receiving element and providing high light-receiving sensitivity may be mounted in the OEICs for BDs.

A phototransistor is an element structured to amplify an output of a photodiode by a transistor and has been popular as a light-receiving element of an optical sensor which is combined with a light-emitting element such as an LED (Light Emission Diode). In OEICs as well, the amplifying function of the phototransistor can be used in order to improve the light-receiving sensitivity to blue light.

In general, phototransistors are superior to photodiodes in the light-receiving sensitivity because the phototransistors have an amplifying function. However, phototransistors are inferior to photodiodes in the operation speed.

In a conventional example described in Japanese Patent Laid-Open Publication No. 5-235394 (Patent document 1), especially in FIG. 1(b) thereof, a light-receiving surface is formed only by a base of a phototransistor, and an emitter thereof is formed only at an end of the light-receiving surface. When light is incident on the light-receiving surface, carriers generated at the light-receiving surface travel through the base to the emitter. The operation speed of the phototransistor depends on the travel speed of the carriers to the emitter. Since the carriers travel to the emitter by diffusion, the speed is decreased due to a resistance component of the base. The structure of Patent document 1 cannot improve the operation speed due to a long horizontal travel distance of the carriers.

In order to solve this problem, it is known in the art that the operation speed is improved by forming the emitter in the whole surface of the base to reduce the horizontal travel distance of the carriers in the base. For example, such a method is disclosed in FIG. 5 of Japanese Laid-Open Patent Publication No. 9-186355 (Patent document 2) and the like.

SUMMARY OF THE INVENTION

The phototransistor of Patent document 2 can implement a reduced horizontal travel distance of the carriers, but reduces the amplifying function.

In order for the amplifying function of a phototransistor to work, it is necessary for carriers generated in a base layer by optical absorption to travel to an emitter layer. In the structure having an emitter layer on a base layer, however, light is absorbed in the emitter layer formed on the base layer, which reduces the amount of light that reaches the base layer. As a result, the amplifying function is reduced, causing reduction in sensitivity. This is a serious problem especially in a phototransistor for blue laser light that is used as a light source of BDs, because a large amount of blue light is absorbed in a relatively shallow region of a semiconductor layer. Therefore, a solution to this problem has been required.

In view of the above problems, it is an object of the invention to provide a phototransistor capable of operating at a high speed and having a high amplifying function and a manufacturing method of such a phototransistor.

An optical semiconductor device according to a first aspect of the invention includes a phototransistor for receiving incident light. The phototransistor includes a collector layer of a first conductivity type formed on a semiconductor substrate, a base layer of a second conductivity type formed on the collector layer, and an emitter layer of a first conductivity type formed on the base layer. A thickness of the emitter layer is equal to or less than an absorption length of the incident light in the semiconductor substrate.

According to the optical semiconductor device of the first aspect of the invention, the sensitivity and operation speed of the phototransistor can be improved as described below.

Since the emitter layer is formed on the base layer (in a light-receiving region) of the phototransistor, the distance for carriers to travel in the base layer until they reach the emitter layer is reduced. In the case where the emitter layer is provided only in the peripheral region of the light-receiving region, carriers need to travel a long distance in the base layer in a horizontal direction (a main-surface direction of a semiconductor substrate) until they reach an emitter layer. By forming the emitter layer also in the light-receiving region, however, the horizontal travel distance is reduced. Accordingly, the operation speed of the phototransistor is improved.

Moreover, the emitter layer has a shallow depth and has a thickness equal to or less than the absorption length of incident light in the semiconductor substrate. Therefore, absorption of incident light in the emitter layer is suppressed, and the amount of incident light that reaches the base layer located under the emitter layer is increased. As a result, the amplifying function of the phototransistor becomes significant. Moreover, carriers generated in the emitter layer are likely to disappear by recombination and are less likely to contribute as an optical current. However, by reducing the thickness of the emitter layer, optical absorption in the emitter layer is reduced and the amount of light carriers that are generated in the emitter layer is reduced. As a result, recombination in the emitter layer can be reduced. The light-receiving sensitivity of the phototransistor is thus improved.

Preferably, the emitter layer is formed so as to cover the base layer.

In this structure, carriers generated in the base layer can reach the emitter layer without traveling in a horizontal direction, and the horizontal travel distance is substantially eliminated. As a result, the operation speed of the phototransistor can further be increased.

Preferably, the emitter layer is formed so as to be buried in an upper part of the base layer, and a part of the emitter layer and a part of the base layer are alternately arranged at a surface of the phototransistor.

In this structure, a part of the base layer and a part of the emitter layer are both exposed at the surface of the phototransistor and are alternately arranged. Therefore, in the region where the part of the base layer is exposed at the surface, the phototransistor can receive incident light without any absorption in the emitter layer. Moreover, carriers generated in the base layer can reach the emitter layer by traveling a relatively short distance in a horizontal direction. Accordingly, both the light-receiving sensitivity and the operation speed can be improved. It should be noted that the emitter layer may have a continuous shape or may be divided into a plurality of portions. The plurality of divided portions of the emitter layer may be electrically connected to each other.

Preferably, the emitter layer has a comb-like, a ladder-like, or a grid-like planar shape.

For example, the emitter layer may have such a planar shape in the case where a part of the emitter layer and a part of the base layer are alternately arranged in a main-surface direction of the semiconductor substrate.

Preferably, the incident light is blue light. The optical semiconductor device according to the first aspect of the invention has a significant effect when receiving blue light.

An optical semiconductor device according to a second aspect of the invention includes a phototransistor for receiving incident light. The phototransistor includes a collector layer of a first conductivity type formed on a semiconductor substrate, a base layer of a second conductivity type formed on the collector layer, and an emitter layer of a first conductivity type buried in the base layer, and a part of the base layer located on the emitter layer has a thickness equal to or larger than an absorption length of the incident light in the semiconductor substrate.

According to the optical semiconductor device of the second aspect of the invention, the sensitivity and operation speed of the phototransistor can be improved as described below as in the case of the optical semiconductor device of the first aspect of the invention.

Since the emitter layer is buried in the base layer, the emitter layer is located also in a light-receiving region of the phototransistor, which reduces the travel distance for carriers to travel in the base layer in a horizontal direction to the emitter layer. As a result, the operation speed of the phototransistor is improved.

Moreover, since the emitter layer is buried in the base layer and the thickness of the part of the base layer located on the emitter layer is equal to or larger than the absorption length of incident light in the semiconductor substrate. Therefore, incident light is mostly absorbed in the base layer, and an increased amount of carriers are generated in the base layer and travel to the emitter layer, contributing to the amplifying function of the phototransistor. As a result, the efficiency of the amplifying function is improved.

Preferably, the emitter layer has such a planar shape that a part of the emitter layer and a part of the base layer are alternately arranged in a main-surface direction of the semiconductor substrate.

Preferably, the emitter layer has a comb-like, a ladder-like, or a grid-like planar shape.

In this case, both the light-receiving sensitivity and the operation speed can be improved as in the case of the optical semiconductor device of the first aspect of the invention.

Preferably, in the part of the base layer located on the emitter layer, a concentration of impurities of a second conductivity type is reduced toward a surface.

With such a concentration gradient, carriers generated at the surface of the base layer are accelerated by an electric field caused by the concentration gradient. As a result, the travel speed of the carriers is increased, and the travel time of the carriers in the base layer can further be reduced.

Preferably, the part of the base layer located on the emitter layer is made of a semiconductor material having a wider bandgap than that of the semiconductor substrate.

In this case, the sensitivity to blue light having a shorter wavelength than infrared light, red light, and the like can be increased.

Preferably, the incident light is blue light. The optical semiconductor device according to the second aspect of the invention has a significant effect when receiving blue light.

As has been described above, according to the optical semiconductor device of the invention, the operation speed can be improved by reducing the horizontal travel distance of carriers generated in the base layer. Moreover, the light-receiving sensitivity can be improved by suppressing optical absorption in the emitter layer and thus increasing the amount of carriers generated in the base layer and improving the amplifying function of the phototransistor. Since both the sensitivity and operation speed are improved, the optical semiconductor device of the invention is useful as optical pickup portions for BDs, DVDs, CDs, and the like, and especially, as optical pickup portions of BDs that use blue light.

BRIEF DESCRIPTION OF THE DRAWINGS

FIGS. 4A, 4B, 4C, and 4D show examples of a planar shape of an N-type diffusion layer 7a in the optical semiconductor device 20a;

FIGS. 5A and 5B are cross-sectional views illustrating a manufacturing process of the optical semiconductor device 20a;

FIGS. 9A, 9B, and 9C are cross-sectional views illustrating a manufacturing process of the optical semiconductor device 20c.

DETAILED DESCRIPTION OF THE PREFERRED EMBODIMENTS

First Embodiment

Figure 1A:
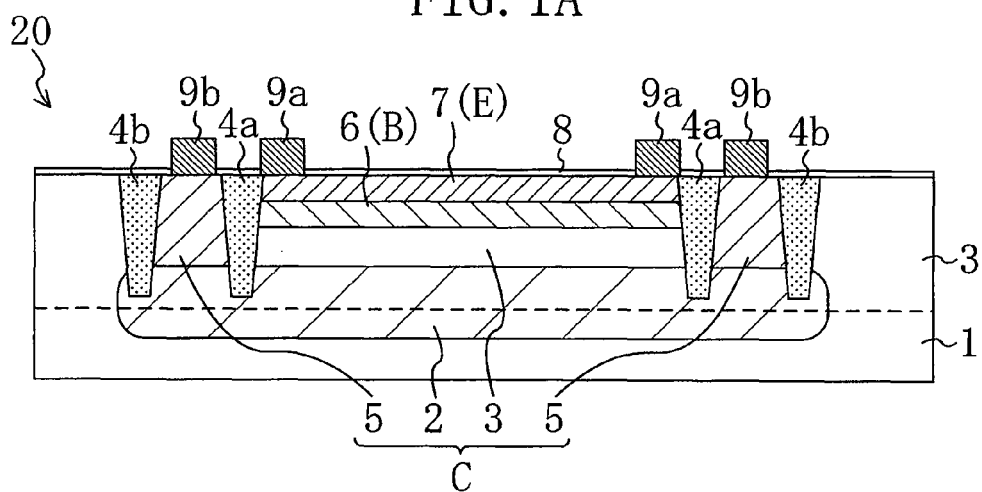
FIGS. 1A and 1B are a cross-sectional view and a plan view showing a structure of an optical semiconductor device 20 according to a first embodiment of the invention, respectively.
Figure 1B:
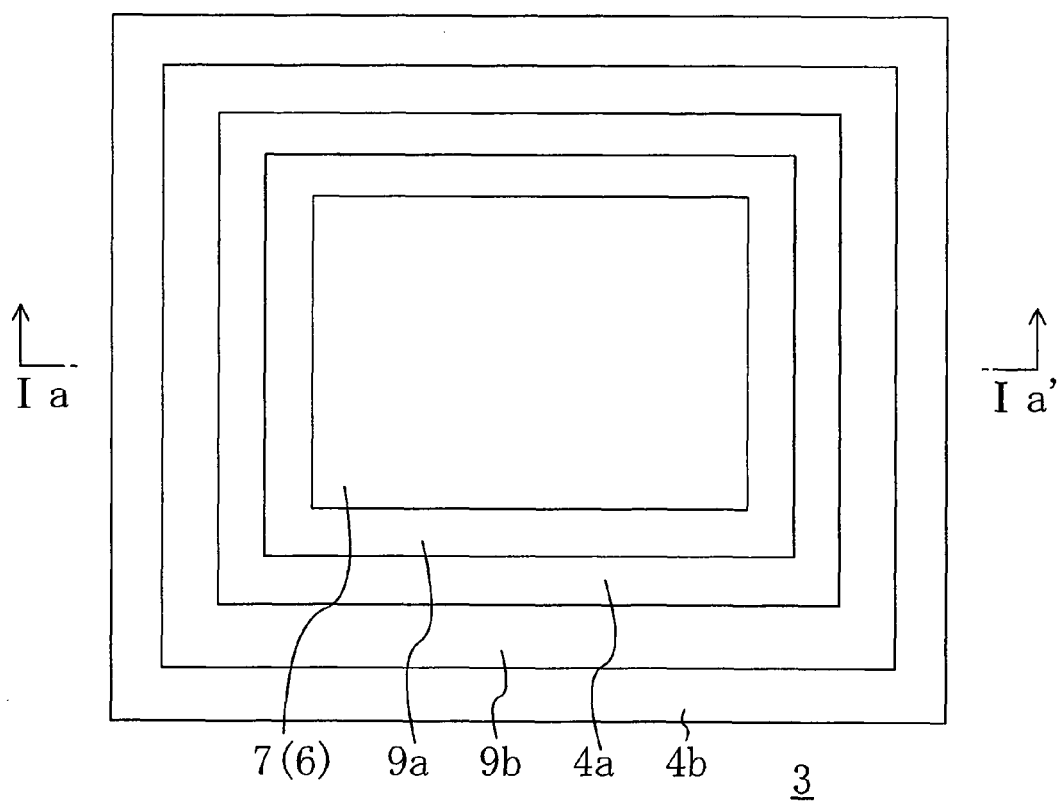

Hereinafter, an optical semiconductor device and a manufacturing method thereof according to a first embodiment of the invention will be described with reference to the figures. FIGS. 1A and 1B are a cross-sectional view and a plan view showing a main part of an optical semiconductor device 20 of the first embodiment, respectively. FIG. 1A shows a cross section taken along line Ia-Ia' in FIG. 1B.

As shown in FIG. 1A, the optical semiconductor device 20 is formed by using a substrate (silicon substrate) 1. An N-type epitaxial growth layer (silicon layer) 3 is formed on the substrate 1, and an N-type buried layer 2 is formed so as to include the interface between the substrate 1 and the N-type epitaxial growth layer 3. A P-type diffusion layer 6 is formed over the N-type buried layer 2 with the N-type epitaxial growth layer 3 left therebetween. An N-type diffusion layer 7 is formed on the P-type diffusion layer 6.

Isolation insulating layers 4a and 4b are formed on a peripheral region of the N-type buried layer 2 so as to extend from the surface side of the optical semiconductor device 20 to the N-type diffusion layer 7. The isolation insulating layers 4a and 4b thus isolate PN junction from the surrounding region. More specifically, an isolation insulating layer 4a surrounding the N-type diffusion layer 7 and the P-type diffusion layer 6 and an isolation insulating layer 4b surrounding the isolation insulating layer 4a are provided, and another N-type diffusion layer 5 is formed between the isolation insulating layers 4a and 4b.

A phototransistor is thus formed in the optical semiconductor device 20. More specifically, this phototransistor has a collector C formed by the N-type buried layer 2, the N-type diffusion layer 5, and the N-type epitaxial growth layer 3, a base B formed by the P-type diffusion layer 6, and an emitter E formed by the N-type diffusion layer 7. Note that the region inside the isolation insulating layer 4a functions as a light-receiving region.

A antireflection film 8 is formed over the N-type epitaxial growth layer 3 so as to cover the N-type diffusion layer 5, the N-type diffusion layer 7, the isolation insulating layers 4a and 4b, and the like. The antireflection film 8 is formed to prevent reflection of incident light from a phototransistor surface and enable efficient introduction of incident light into the phototransistor. The antireflection film 8 is generally formed as a layered film of a silicon oxide film and a silicon nitride film.

The antireflection film 8 has an opening on the N-type diffusion layer 7, and an electrode 9a is formed on the opening as an emitter electrode. The antireflection film 8 has another opening on the N-type diffusion layer 5, and an electrode 9b is formed on the opening. The electrode 9b is electrically connected to the N-type buried layer 2 through the N-type diffusion layer 5 and functions as a collector electrode.

FIG. 1B is a plan view of the optical semiconductor device 20. Note that the antireflection film 8 is not shown in FIG. 1B. As shown in FIG. 1B, the N-type epitaxial growth layer 3 is doubly isolated by the isolation insulating layers 4a and 4b. The N-type diffusion layer 7 is formed on a surface of a region inside the inner isolation insulating layer 4a and this region serves as a light-receiving region. The electrode 9a is formed on the N-type diffusion layer 7, and the electrode 9b is formed on a region between the isolation insulating layers 4a and 4b (a region where the N-type diffusion layer 5 is formed; the N-type diffusion layer 5 is not shown in FIG. 1B).

Operation of the optical semiconductor device 20 will now be described.

When light is incident on the optical semiconductor device 20, light that has reached the P-type diffusion layer 6 serving as a base is absorbed by silicon of the P-type diffusion layer 6 and carriers are generated. When the carriers travel to the N-type diffusion layer 7 serving as an emitter, the phototransistor operates by using the carriers as a base current. The phototransistor amplifies the base current and outputs the amplified current as a collector current. The operation principle of the phototransistor is substantially the same as that of a normal bipolar transistor except that carriers generated by light incidence contribute as a base current.

In the optical semiconductor device 20 of this embodiment, the N-type diffusion layer 7 (emitter E) covers the whole surface of the P-type diffusion layer 6 (base B). In other words, the N-type diffusion layer 7 is formed on the whole surface of the light-receiving region. This structure enables the carriers generated in the P-type diffusion layer 6 to reach the N-type diffusion layer 8 without the need to travel in a horizontal direction (a main-surface direction of the substrate 1). As a result, the phototransistor operates at a high speed.

In this structure, however, incident light cannot enter the P-type diffusion layer 6 without passing through the N-type diffusion layer 7. Therefore, optical absorption occurs also in the N-type diffusion layer 7, whereby carriers are generated in the N-type diffusion layer 7. Since the N-type diffusion layer 7 is close to the surface of the optical semiconductor device 20, carrier recombination is likely to occur and therefore the generated carriers are likely to disappear. Moreover, since these carriers are generated in the emitter layer, even the carriers that are not recombined do not contribute to the amplifying function of the phototransistor, causing reduction in sensitivity as a light-receiving element.

In view of the above problem, in the optical semiconductor device 20, optical absorption and carrier recombination in the N-type diffusion layer 7 are suppressed by forming a shallow (thin) N-type diffusion layer 7. This increases the amount of light that reaches the P-type diffusion layer 6 located under the N-type diffusion layer 7, whereby sensitivity of the light-receiving element can be improved.

In general, about 63% of incident light is absorbed in the range from the surface of an object to the optical absorption length (the reciprocal of an absorption coefficient). Therefore, if the depth (thickness) of the N-type diffusion layer 7 (emitter) is larger than the absorption length of incident light, the proportion of carriers that disappear becomes dominant. Therefore, the N-type diffusion layer 7 is formed with a depth equal to or less than the absorption length of incident light. For example, in the case of blue light used in BDs, the absorption length in silicon is about 0.3 μm. Therefore, the depth of the N-type diffusion layer 7 formed in the silicon layer is set to 0.3 μm or less.

Specific examples of sensitivity are as follows: a conventional PIN photodiode has a sensitivity of 0.28 A/W and a phototransistor having a conventional structure has 20.70 A/W, while the phototransistor of this embodiment has 26.60 A/W. The sensitivity of the phototransistor of this embodiment is about 100 times that of the conventional PIN photodiode and is higher than that of the phototransistor having a conventional structure.

Specific examples of frequency characteristics are as follows: the phototransistor having a conventional structure has frequency characteristics of 10 kHz, while the phototransistor of this embodiment has frequency characteristics of 200 kHz. The frequency characteristics of the phototransistor of this embodiment are about 20 times higher than those of the photodiode having a conventional structure.

Note that the conventional PIN photodiode is a layered structure in which an intermediate concentration cathode layer is formed on a low concentration anode layer. An example of such a PIN photodiode is disclosed in FIG. 7 of Japanese Laid-Open Patent Publication No. 2003-158251 (Patent document 3). An example of the phototransistor having a conventional structure is a phototransistor having a structure shown in FIGS. 3(a) and 3(b) of Patent document 1.

In this embodiment, high-speed operation is implemented by forming the N-type diffusion layer 7 on the whole surface of the P-type diffusion layer 6, as described above. At the same time, reduction in sensitivity of the light-receiving element caused by forming the N-type diffusion layer 7 on the whole surface of the P-type diffusion layer 6 is suppressed. Such an effect is significant in a device for receiving blue light that is absorbed in a shallower region of a phototransistor as compared to red light and the like.

Figure 2A:
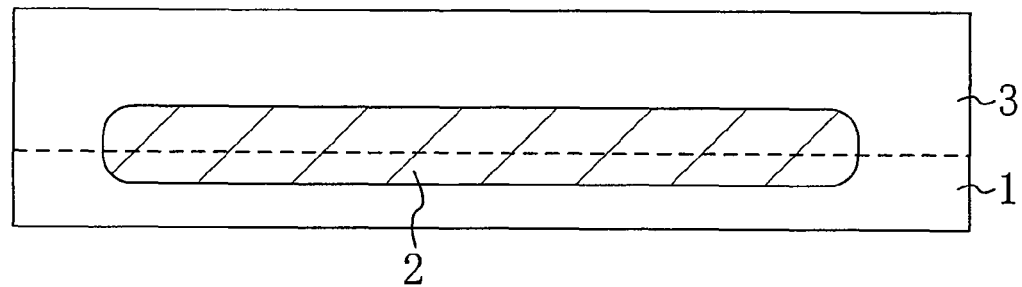
FIGS. 2A, 2B, and 2C are cross-sectional views illustrating a manufacturing process of the optical semiconductor device 20.
Figure 2B:
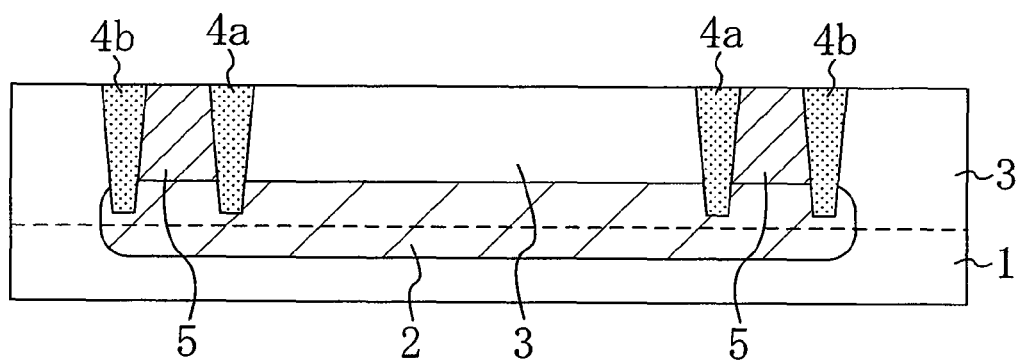
Figure 2C:
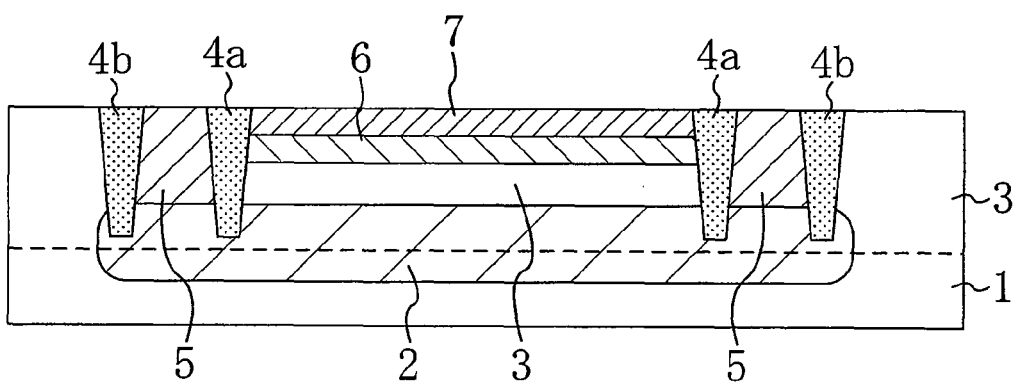

Hereinafter, a method for manufacturing the optical semiconductor device 20 of this embodiment will be described. FIGS. 2A through 2C are cross-sectional views illustrating a manufacturing method of the optical semiconductor device 20.

As shown in FIG. 2A, after impurities are introduced into a surface of a substrate 1, an N-type epitaxial growth layer 3 is formed, and an N-type buried layer 2 is formed by diffusing the impurities. This process can be performed by using known technologies such as lithography technology, etching technology, epitaxy technology, and ion implantation technology.

As shown in FIG. 2B, isolation insulating layers 4a and 4b are then formed by using etching technology and CVD (Chemical Vapor Deposition) technology. It should be noted that, instead of trench isolation technology used herein, isolation insulating films may be formed by thermal oxidation. Thereafter, an N-type diffusion layer 5 extending to the N-type buried layer 2 is then formed between the isolation insulating layers 4a and 4b. The N-type diffusion layer 5 can be formed by ion implantation and annealing.

As shown in FIG. 2C, a P-type diffusion layer 6 and an N-type diffusion layer 7 are then sequentially formed on the N-type epitaxial growth layer 3 in a region inside the isolation insulating layer 4a by using lithography technology, ion implantation technology, annealing, and the like. Note that the P-type diffusion layer 6 has such a depth that the P-type diffusion layer 6 does not contact the N-type buried layer 2. A phototransistor is thus formed with a collector formed by the N-type diffusion layer 5, the N-type buried layer 2, and a part of the N-type epitaxial growth layer 3, a base formed by the P-type diffusion layer 6, and an emitter formed by the N-type diffusion layer 7.

The N-type diffusion layer 7 serving as an emitter needs to have a shallow depth, as described above. For example, in order to receive blue light, the N-type diffusion layer 7 needs to have a depth of 0.3 μm or less (In other words, the N-type diffusion layer 7 needs to have a thickness of 0.3 μm or less). Conditions of the processes such as ion implantation and heat treatment are determined so as to implement this depth.

For example, when arsenic (As) is used as ion species, the N-type diffusion layer 7 having a depth of 0.3 μm or less can be formed by performing ion implantation at an acceleration energy of 20 keV and then diffusing the ions in a reflow process (at 850° C. for 60 minutes) for planarizing an interlayer film (not shown).

When antimony (Sb) is used as ion species, the N-type diffusion layer 7 having a depth of 0.3 μm or less can be formed by performing ion implantation at an acceleration energy of 30 keV and then performing a reflow process under the same conditions as in the case of As.

The optical semiconductor device 20 shown in FIG. 1A is obtained through processes using CVD technology, sputtering technology, lithography technology, etching technology, and the like. More specifically, after the step of FIG. 2C, an antireflection film 8 is formed over the N-type epitaxial growth layer 3 so as to cover the N-type diffusion layer 7, the N-type diffusion layer 5, and the like. For example, a silicon nitride film that can be easily formed may be used as the antireflection film 8.

Electrodes 9a and 9b are then formed on the N-type diffusion layer 7 and the N-type diffusion layer 5, respectively. At this time, openings are formed in the corresponding portions of the antireflection film 8 in order to obtain electric connection. The electrodes 9a and 9b may be made of any metal material such as Al (aluminum) and Cu (copper). In addition to the metal materials, a transparent electrode (ITO (Indium Tin Oxide)) may be used as the electrodes 9a and 9b.

The optical semiconductor device 20 of this embodiment is manufactured as described above. Note that the desirable materials, dimensions, conditions of various processes, and the like are described above, but the invention is not limited to those described above.

Second Embodiment

Figure 3:
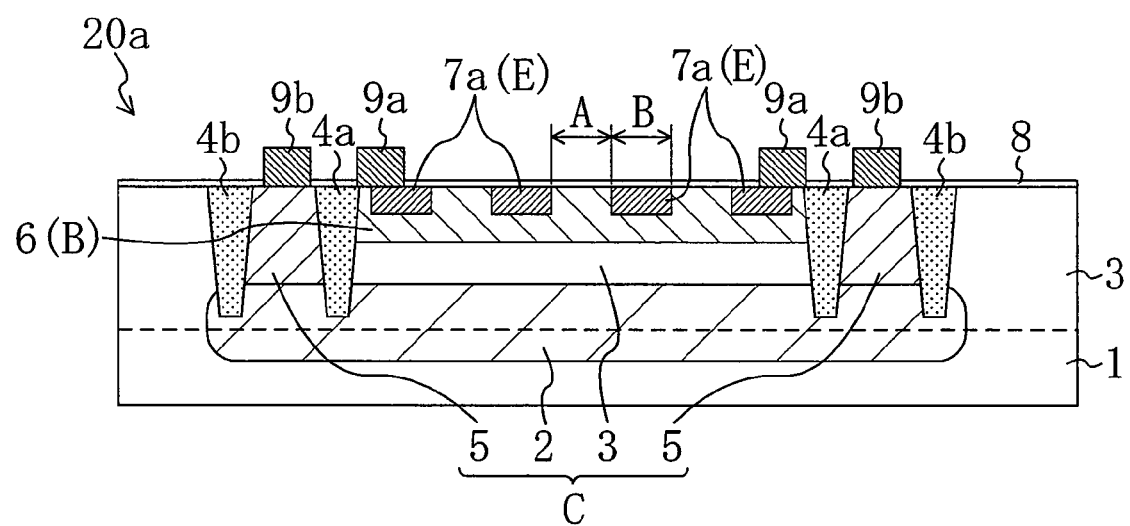
FIG. 3 is a cross-sectional view showing a structure of an optical semiconductor device 20a according to a second embodiment of the invention.

Hereinafter, an optical semiconductor device and a manufacturing method thereof according to a second embodiment of the invention will be described with reference to the figures. FIG. 3 is a cross-sectional view of a main part of an optical semiconductor device 20a according to this embodiment. The optical semiconductor device 20a is substantially the same as the optical semiconductor device 20 (FIG. 1A) of the first embodiment except that the N-type diffusion layer 7 serving as an emitter is replaced with an N-type diffusion layer 7a. In FIG. 3, the same components as those of FIG. 1A are denoted with the same reference numerals and characters, and detailed description thereof will be omitted.

In the optical semiconductor device 20 of FIG. 1A, the N-type diffusion layer 7 covers the whole surface of the P-type diffusion layer 6. This means that the N-type diffusion layer 7 covers the whole light-receiving surface of the phototransistor.

In the optical semiconductor device 20a of this embodiment shown in FIG. 3, on the other hand, the N-type diffusion layer 7a serving as an emitter E is buried in an upper part of the P-type diffusion layer 6 serving as a base B. The N-type diffusion layer 7a thus covers a part of the P-type diffusion layer 6, and a part of the N-type diffusion layer 7a and a part of the P-type diffusion layer 6 are alternately arranged in a main-surface direction of the substrate 1. This structure is implemented by setting the planar shape of the N-type diffusion layer 7a.

Figure 4A:
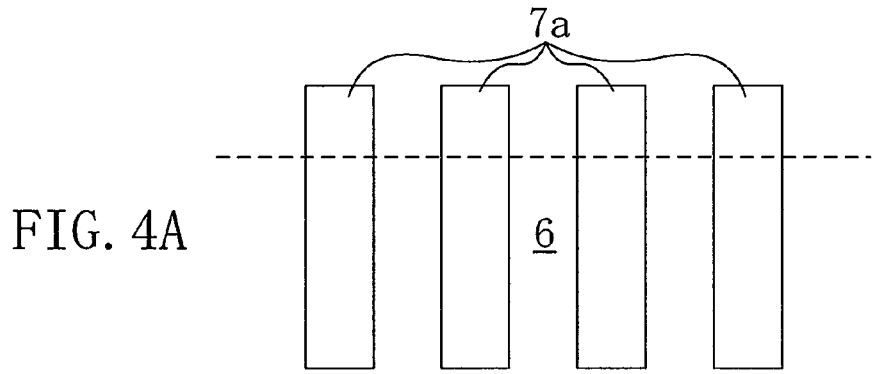
Figure 4B:
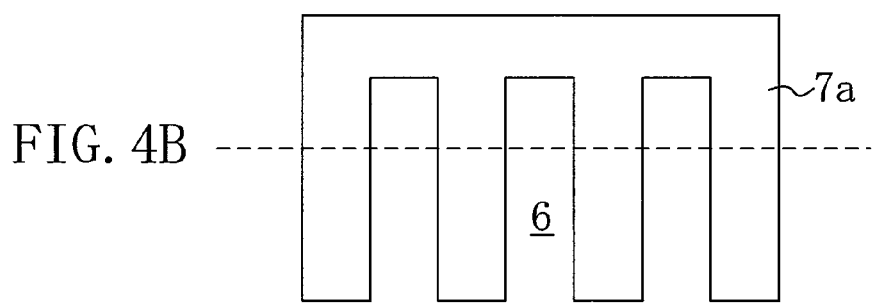
Figure 4C:
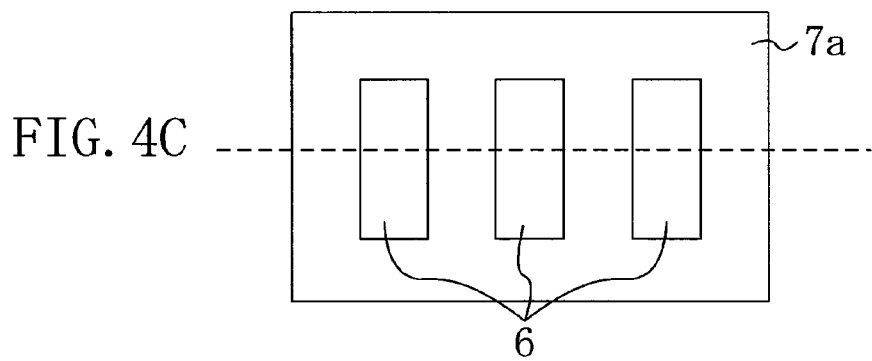
Figure 4D:
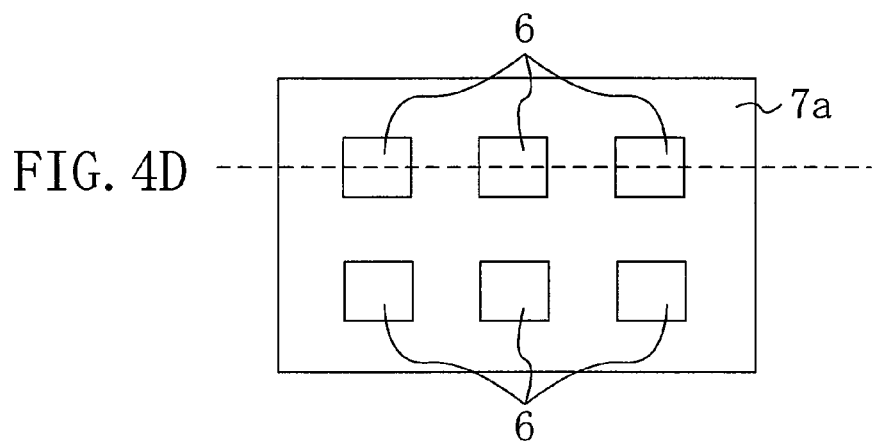

FIGS. 4A through 4D show specific examples of the planar shape of the N-type diffusion layer 7a. In FIG. 4A, the N-type diffusion layer 7a has such a planar shape that a plurality of stripes are arranged. In FIG. 4B, the N-type diffusion layer 7a has a comb-like planar shape in which a plurality of stripes are connected together at one end. In FIG. 4C, the N-type diffusion layer 7a has a ladder-like planar shape in which a plurality of stripes are connected together at both ends. In FIG. 4D, the N-type diffusion layer 7a has a grid-like planar shape in which a plurality of stripes cross each other in horizontal and vertical directions. In each of the above examples, a part of the N-type diffusion layer 7a and a part of the P-type diffusion layer 6 are alternately arranged when viewed in the direction shown by a broken line in FIGS. 4A though 4D, which is one of the directions along the main surface of the substrate 1.

Note that, since the N-type diffusion layer 7a is supposed to function as a conductive path extending to the electrode 9a (see FIG. 3), it is preferable that the N-type diffusion layer 7a does not have any isolated part. In the case where the N-type diffusion layer 7a is formed as a plurality of separated parts as shown in FIG. 4A, the electrode 9a is formed so as to be connected to each of the separated parts.

By using the N-type diffusion layer 7a having such a planar shape, the light-receiving sensitivity can be improved while suppressing reduction in operation speed of the phototransistor, as described below.

In the optical semiconductor device 20 of the first embodiment, the N-type diffusion layer 7 serving as an emitter is formed on the whole surface of the P-type diffusion layer 6 serving as a base. Therefore, carriers reach the emitter without traveling within the base in a horizontal direction. Moreover, by forming the N-type diffusion layer 7 with a shallow depth, absorption of incident light in the N-type diffusion layer 7 is suppressed and the light-receiving sensitivity is improved.

In the optical semiconductor device 20a of this embodiment, on the other hand, the N-type diffusion layer 7a does not cover the entire surface of the P-type diffusion layer 6. In the region that is not covered by the N-type diffusion layer 7a, incident light reaches the P-type diffusion layer 6 without passing through the N-type diffusion layer 7a and therefore without being absorbed and attenuated by the N-type diffusion layer 7a. Accordingly, the light-receiving sensitivity is improved over the structure in which the whole surface of the P-type diffusion layer 6 is covered by the N-type diffusion layer 7.

Moreover, since a part of the N-type diffusion layer 7a and a part of the P-type diffusion layer 6 are alternately arranged in a main-surface direction of the substrate 1, carriers generated in the exposed region of the P-type diffusion layer 6 reach the N-type diffusion layer 7a by traveling only a relatively short distance in a horizontal direction, and function as a base current. Therefore, the operation speed of the phototransistor is increased as compared to the case where the emitter is formed only at an end of the base.

In order to reliably obtain the above structure, it is preferable that the planar shape of the N-type diffusion layer 7a has a pattern having somewhat small dimensions. For example, in FIG. 3, it is preferable that the distance A between the parts of the N-type diffusion layer 7a (the width of the region of the P-type diffusion layer 6 which is located between the parts of the N-type diffusion layer 7a) is about 1 µm. If the distance A is larger than about 1 µm, the horizontal travel distance of carriers is increased and the operation speed of the phototransistor is reduced. Note that the light-receiving region (in the case of FIG. 3, the region inside the isolation insulating layer 4a) is, for example, about 100 µm each side (each figure is a schematic view and does not show an actual scale).

Light-receiving efficiency decreases with an increase in the proportion of the N-type diffusion layer 7a in the light-receiving region. Therefore, it is desirable that the N-type diffusion layer 7a has a small pattern width B. For example, the pattern width B is preferably about 1 µm like the distance A between the parts of the N-type diffusion layer 7a.

Note that, like the N-type diffusion layer 7 of the first embodiment, the N-type diffusion layer 7a of this embodiment is also formed with a shallow depth (for example, with a depth of 0.3 µm or less). Therefore, as in the case of the first embodiment, light that is incident on the N-type diffusion layer 7a reaches the P-type diffusion layer 6 without being absorbed so much in the N-type diffusion layer 7a.

The optical semiconductor device 20a thus implements a higher operation speed and higher sensitivity of the phototransistor.

Figure 5A:
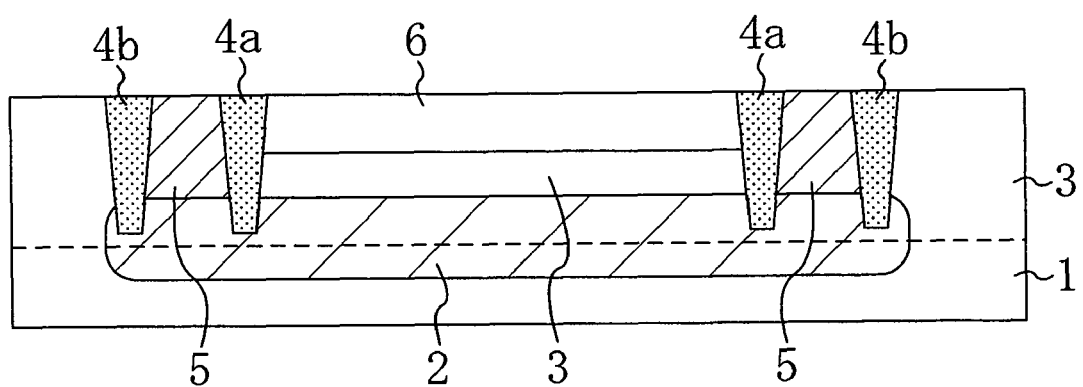
Figure 5B:
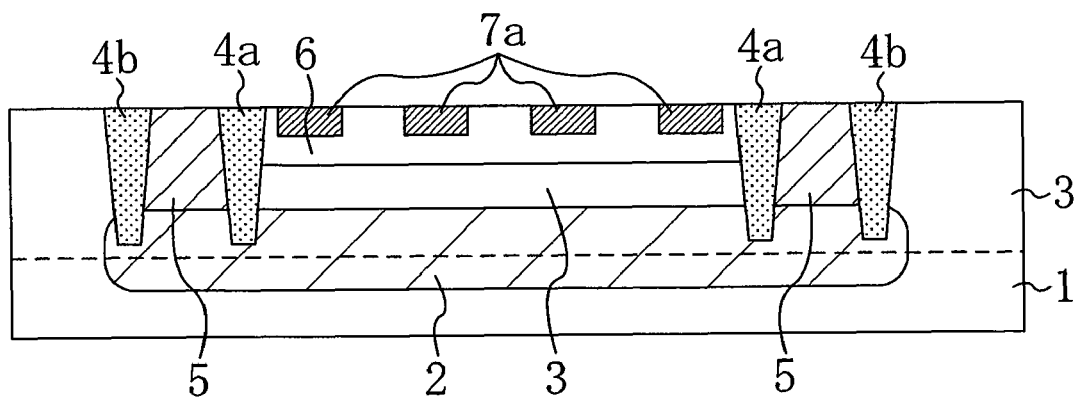

Hereinafter, a method for manufacturing the optical semiconductor device 20a of this embodiment will be described. FIGS. 5A and 5B are cross-sectional views illustrating a manufacturing method of the optical semiconductor device 20a.

First, the process up to FIG. 2B is performed in the same manner as described in the first embodiment. As shown in FIG. 5A, a P-type diffusion layer 6 is then formed in the N-type epitaxial growth layer 3 in the region inside the isolation insulating layer 4a. The P-type diffusion layer 6 has such a depth that the P-type diffusion layer 6 does not contact the N-type buried layer 2.

As shown in FIG. 5B, an N-type diffusion layer 7a is formed on a part of the P-type diffusion layer 6. For example, the N-type diffusion layer 7a has such a planar shape as shown in FIGS. 4A though 4D. The depth of the N-type diffusion layer 7a can be made as shallow as 0.3 µm or less by performing an ion implantation process and a reflow process for planarizing an interlayer film as in the first embodiment.

Thereafter, an antireflection film 8 and electrodes 9a and 9b are formed in the same manner as in the first embodiment, whereby the optical semiconductor device 20a of FIG. 3 is obtained. The materials and the like used in the second embodiment may be the same as those of the first embodiment.

Third Embodiment

Figure 6:
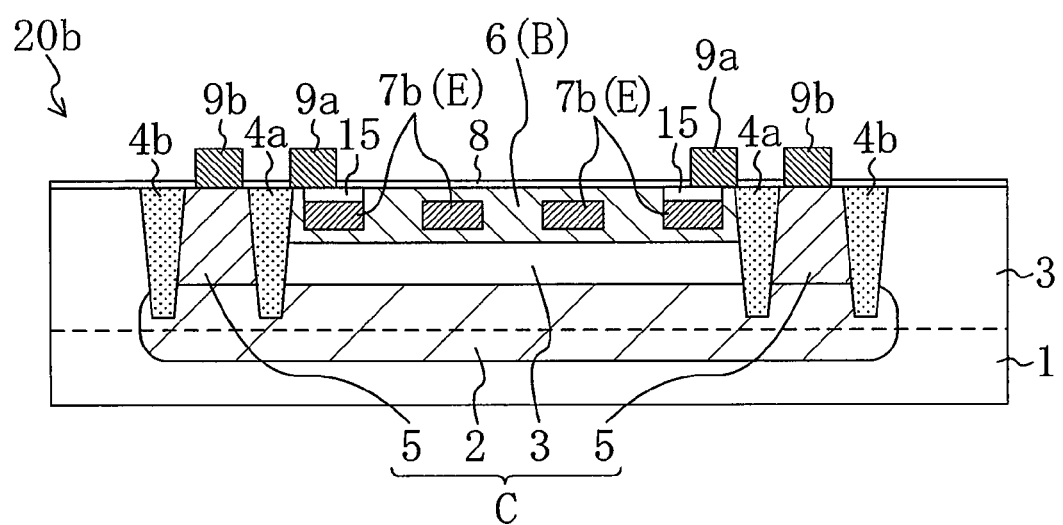
FIG. 6 is a cross-sectional view showing a structure of an optical semiconductor device 20b according to a third embodiment of the invention.

Hereinafter, an optical semiconductor device and a manufacturing method thereof according to a third embodiment of the invention will be described with reference to the figures. FIG. 6 is a cross-sectional view of a main part of an optical semiconductor device 20b of this embodiment. The optical semiconductor device 20b is substantially the same as the optical semiconductor device 20a (FIG. 3) of the second embodiment except that the N-type diffusion layer 7 serving as an emitter is replaced with an N-type diffusion layer 7b. In FIG. 6, the same components as those in FIG. 3 are denoted with the same reference numerals and characters, and detailed description thereof will be omitted.

In the optical semiconductor device 20a of FIG. 3, the N-type diffusion layer 7a is formed on the P-type diffusion layer 6 and the N-type diffusion layer 7a is covered by the antireflection film 8.

In the optical semiconductor device 20b of this embodiment in FIG. 6, on the other hand, the N-type diffusion layer 7b is buried in the P-type diffusion layer 6. In other words, the N-type diffusion layer 7b is covered by a part of the P-type diffusion layer 6. Note that, for electric connection between the electrode 9a serving as an emitter electrode and the N-type diffusion layer 7b, an additional N-type diffusion layer 15 is formed between the electrode 9a and the N-type diffusion layer 7b.

In this structure, incident light cannot reach the N-type diffusion layer 7b serving as an emitter without passing through the P-type diffusion layer 6 formed thereon. In other words, incident light does not directly enter the N-type diffusion layer 7b. Therefore, recombination in the N-type diffusion layer 7b serving as an emitter is suppressed, and the amount of light to be absorbed in the P-type diffusion layer 6 serving as a base is increased. As a result, efficiency of the amplifying function of the phototransistor is increased and the light-receiving sensitivity is improved.

Note that the N-type diffusion layer 7b is preferably formed at a depth that is equal to or larger than an absorption length of incident light from the surface. In other words, the thickness of the P-type diffusion layer 6 on the N-type diffusion layer 7b is preferably equal to or larger than an absorption length of incident light in silicon. This is desirable because a sufficient proportion of incident light is absorbed in the P-type diffusion layer 6 before the incident light reaches the N-type diffusion layer 7b. In the case of receiving blue light, the P-type diffusion layer 6 preferably has a thickness of 0.3 μm or more on the N-type diffusion layer 7b.

The planar shape and dimensions of the N-type diffusion layer 7b are the same as those of the N-type diffusion layer 7a of the second embodiment. In other words, a part of the N-type diffusion layer 7b and a part of the P-type diffusion layer 6 are alternately arranged in a main-surface direction of the substrate 1. FIGS. 4A through 4D are also specific example of the N-type diffusion layer 7b. It is preferable that the pattern width B of the N-type diffusion layer 7b and the distance A between the parts of the N-type diffusion layer 7b are somewhat small. The pattern width B and the distance A is preferably about 1 μm. As in the second embodiment, by using such an N-type diffusion layer 7b, the horizontal travel distance of carriers in the P-type diffusion layer 6 serving as a base is reduced, whereby the operation speed of the phototransistor can be increased.

Figure 7A:
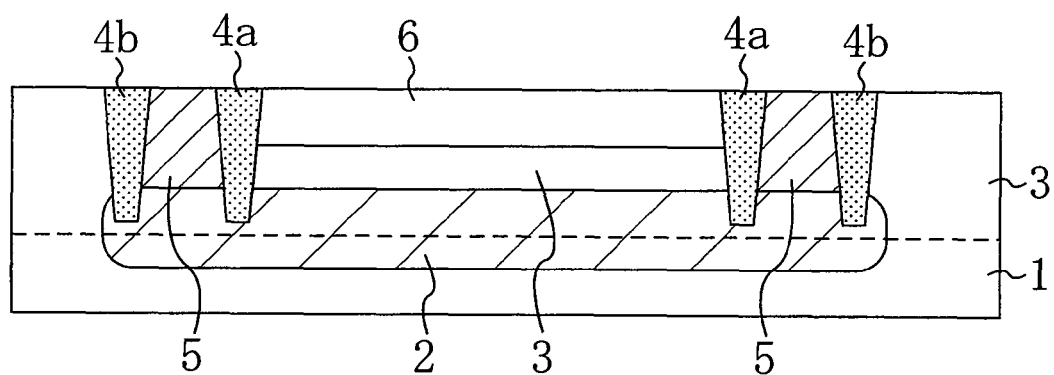
FIGS. 7A and 7B are cross-sectional views illustrating a manufacturing process of the optical semiconductor device 20b.
Figure 7B:
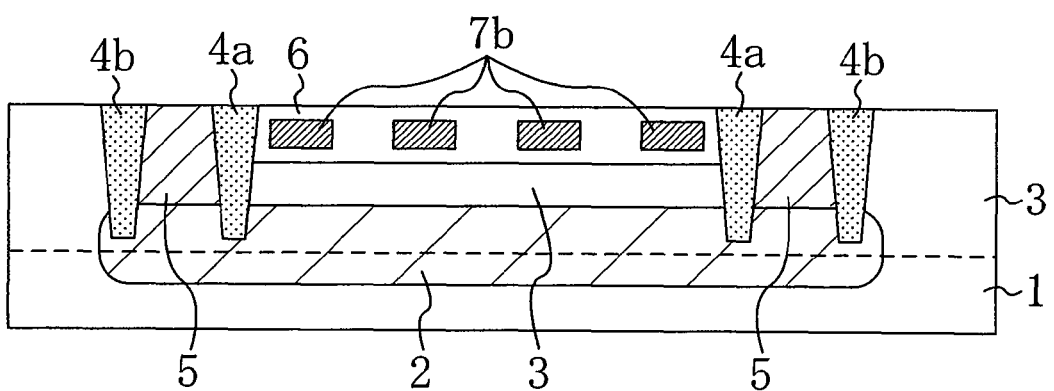

Hereinafter, a method for manufacturing the optical semiconductor device 20b of this embodiment will be described. FIGS. 7A and 7B are cross-sectional views illustrating a manufacturing method of the optical semiconductor device 20b.

First, the process up to FIG. 2B is performed in the same manner as described in the first embodiment. As shown in FIG. 7A, a P-type diffusion layer 6 is then formed in the N-type epitaxial growth layer 3 in the region inside the isolation insulating layer 4a. The P-type diffusion layer 6 has such a depth that the P-type diffusion layer 6 does not contact the N-type buried layer 2.

Thereafter, as shown in FIG. 7B, an N-type diffusion layer 7b is formed by ion implantation and annealing so as to be buried in the P-type diffusion layer 6.

When phosphorus (P) is used as ion species, the N-type diffusion layer 7b can be formed at a depth of 0.3 μm or more in the P-type diffusion layer 6 by performing ion implantation at an acceleration energy of 200 keV or more.

When arsenic (As) is used as ion species, the N-type diffusion layer 7b can be formed at a depth of 0.3 μm or more in the P-type diffusion layer 6 by performing ion implantation at an acceleration energy of 500 keV or more and heat treatment (850° C. to 900° C.) such as reflow.

When antimony (Sb) is used as ion species, the N-type diffusion layer 7b can be formed at a depth of 0.3 μm or more in the P-type diffusion layer 6 by performing ion implantation at an acceleration energy of 800 keV and heat treatment (850° C. to 900° C.) such as reflow.

Note that, in order to suppress diffusion of ion species, it is desirable not to perform heat treatment at a high temperature for a long time after ion implantation.

Thereafter, an additional N-type diffusion layer 15 for electric connection between the electrode 9a and the N-type diffusion layer 7b is provided. An antireflection film 8 and electrodes 9a and 9b are then formed in the same manner as described in the first embodiment, whereby the optical semiconductor device 20b of FIG. 6 is obtained. The materials and the like used in the third embodiment may be the same as those of the first embodiment.

Fourth Embodiment

Figure 8:
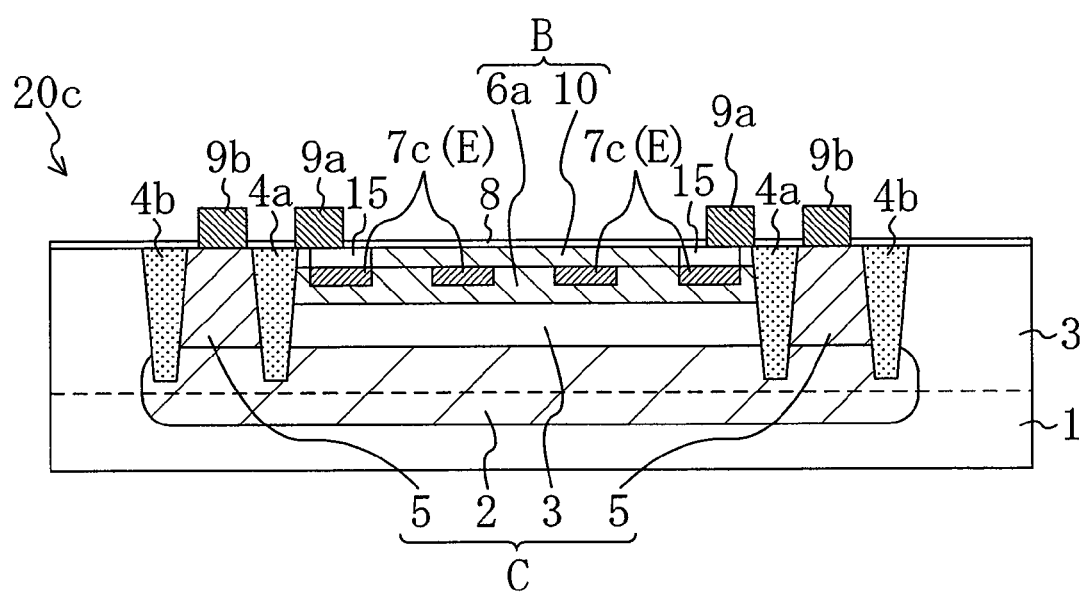
FIG. 8 is a cross-sectional view showing a structure of an optical semiconductor device 20c according to a fourth embodiment of the invention.

Hereinafter, an optical semiconductor device and a manufacturing method thereof according to a fourth embodiment of the invention will be described with reference to the figures. FIG. 8 is a cross-sectional view of a main part of an optical semiconductor device 20c of this embodiment. The optical semiconductor device 20c is substantially the same as the optical semiconductor device 20b (FIG. 6) of the third embodiment except the structure of the base portion. In FIG. 8, the same components as those in FIG. 6 are denoted with the same reference numerals and characters, and detailed description thereof will be omitted.

In the optical semiconductor device 20b of FIG. 6, the base portion is formed by the P-type diffusion layer 6. In the optical semiconductor device 20c of FIG. 8, on the other hand, a base portion B is formed by a P-type diffusion layer 6a and a P-type epitaxial growth layer (silicon layer) 10 formed over the P-type diffusion layer 6a.

With this structure as well, an emitter E (N-type diffusion layer 7c) is buried in the base B, and the same effects as those of the optical semiconductor device 20b of the third embodiment can be obtained.

Hereinafter, a method for manufacturing the optical semiconductor device 20c of this embodiment will be described. FIGS. 9A through 9C are cross-sectional views illustrating a manufacturing method of the optical semiconductor device 20c.

First, the process shown in FIG. 2A is performed in the same manner as described in the first embodiment.

Thereafter, as shown in FIG. 9A, a P-type diffusion layer 6a is formed above the N-type buried layer 2 by introducing P-type impurities into the N-type epitaxial growth layer 3.

As shown in FIG. 9B, an N-type diffusion layer 7c is formed on the P-type diffusion layer 6a by introduced N-type impurities into the P-type diffusion layer 6a.

As shown in FIG. 9C, a P-type epitaxial growth layer 10 is formed over the N-type epitaxial growth layer 3 so as to cover the P-type diffusion layer 6a and the N-type diffusion layer 7c. For example, an epitaxial process is performed by reduced-pressure, single-wafer processing by using a trichlorosilane ($SiHCl_3$) gas as a source gas. The growth temperature is about 1,100° C. and the gas flow rate is adjusted so that the growth rate becomes 2 μm/min.

Thereafter, isolation insulating layers 4a and 4b are formed, and an N-type diffusion layer 5 extending to the N-type buried layer 2 is formed in a region between the isolation insulating layers 4a and 4b. An antireflection film 8 and electrodes 9a and 9b are then formed, whereby the optical semiconductor device 20c of FIG. 8 is obtained.

First Modification of the Fourth Embodiment

Hereinafter, a first modification of the fourth embodiment will be described. An optical semiconductor device of this modification is different from the optical semiconductor device 20c of the fourth embodiment shown in FIG. 8 in that the P-type epitaxial growth layer 10 has an impurity concentration gradient. In this example, the impurity concentration in the P-type epitaxial growth layer 10 is increased toward the substrate 1.

When there is a concentration gradient in a surface layer of the base, carriers generated at the surface of the light-receiving region are accelerated by an electric field of the concentration gradient, whereby the traveling speed of the carriers is increased. As a result, the travel time in the base is reduced, whereby the operation speed of the phototransistor is increased.

Such a concentration gradient can be produced during formation of the P-type epitaxial growth layer 10 shown in FIG. 9C. In other words, in the epitaxial growth, the amount of boron to be doped is reduced as the P-type epitaxial growth layer 10 grows. The concentration gradient in which the concentration is higher on the side of the substrate 1 and is reduced toward the surface can thus be implemented.

Second Modification of the Fourth Embodiment

Hereinafter, a second modification of the fourth embodiment will be described. An optical semiconductor device of this modification is different from the optical semiconductor device 20c of the fourth embodiment in that the P-type epitaxial growth layer 10 is made of a semiconductor material other than silicon and has a hetero junction. For example, in order to increase the sensitivity to blue light having a short wavelength, the epitaxial growth layer may be made of $SiC_x$ ($0<x<1$) capable of implanting a wider bandgap than Si.

Although an NPN type phototransistor is described in the first through fourth embodiments (including modifications), the phototransistor of the invention may be a PNP type phototransistor. For example, P type and N-type of the layers may be reversed from those shown in FIG. 1A.

What is claimed is:

1. An optical semiconductor device, comprising a phototransistor for receiving incident light,
   wherein the phototransistor includes a N-type buried layer formed on a semiconductor substrate, a collector layer of a first conductivity type formed directly on the buried layer, a base layer of a second conductivity type formed on the collector layer, an emitter layer of a first conductivity type buried in the base layer, and an insulating layer extending to the N-type buried layer from a surface of the emitter layer, and
   a part of the base layer covering the emitter layer has a thickness equal to or larger than an absorption length of the incident light in the semiconductor substrate.

2. The optical semiconductor device according to claim 1, wherein the emitter layer has such a planar shape that a part of the emitter layer and a part of the base layer are alternately arranged in a main-surface direction of the semiconductor substrate.

3. The optical semiconductor device according to claim 2, wherein the emitter layer has a comb shape, a ladder shape, or a grid planar shape.

4. The optical semiconductor device according to claim 1, wherein in the part of the base layer located on the emitter layer, a concentration of impurities of a second conductivity type is reduced toward a surface.

5. The optical semiconductor device according to claim 1, the part of the base layer located on the emitter layer is made of a semiconductor material having a wider bandgap than that of the semiconductor substrate.

6. The optical semiconductor device according to claim 1, wherein the incident light is blue light.

\* \* \* \* \*